United States Patent
Chung et al.

(10) Patent No.: US 7,674,111 B2
(45) Date of Patent: Mar. 9, 2010

(54) LIGHT EMITTING DIODE MODULE FOR LIGHTING

(75) Inventors: Kilyoan Chung, Gyeonggi-do (KR); Il Ku Kim, Gyeonggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/153,040

(22) Filed: May 13, 2008

(65) Prior Publication Data

US 2008/0299787 A1 Dec. 4, 2008

(30) Foreign Application Priority Data

May 29, 2007 (KR) .................. 10-2007-0052246

(51) Int. Cl.
*H01R 12/00* (2006.01)

(52) U.S. Cl. .......................... 439/56; 439/936

(58) Field of Classification Search ............ 439/56, 439/519, 936; 362/800
See application file for complete search history.

(56) References Cited

U.S. PATENT DOCUMENTS 5,834,848 A * 11/1998 Iwasaki .................. 257/778

FOREIGN PATENT DOCUMENTS

| KR | 20-0368712 Y1 | 12/2004 |
| KR | 10-2005-0026976 A | 3/2005 |
| KR | 10-2006-0063179 A | 6/2006 |
| KR | 10-0680654 B1 | 2/2007 |

OTHER PUBLICATIONS

Korean Notice of Allowance Issued in Patent Application No. 10-2007-0052246 dated on Sep. 18, 2008.

* cited by examiner

*Primary Examiner*—Khiem Nguyen
(74) *Attorney, Agent, or Firm*—McDermott Will & Emery LLP

(57) ABSTRACT

Provided is an LED module for lighting, which includes a printed circuit board (PCB); at least one or more LED elements mounted on the PCB; and a waterproof agent surrounding terminals between the PCB and the LED elements, which are exposed on mounting surface of the LED elements.

20 Claims, 2 Drawing Sheets

[FIG. 1]
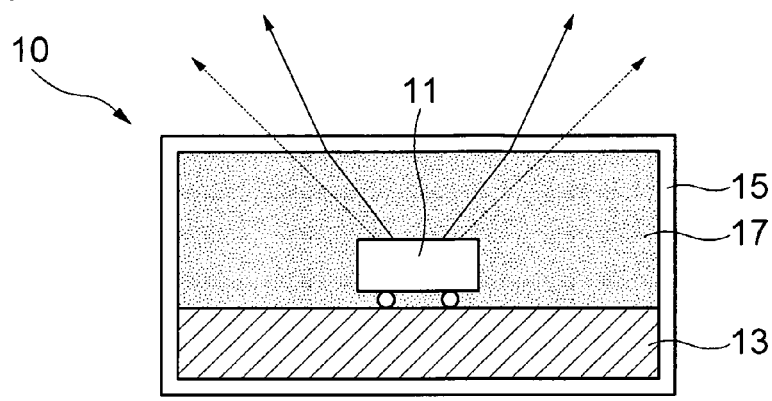
- Prior Art -
[FIG. 2]
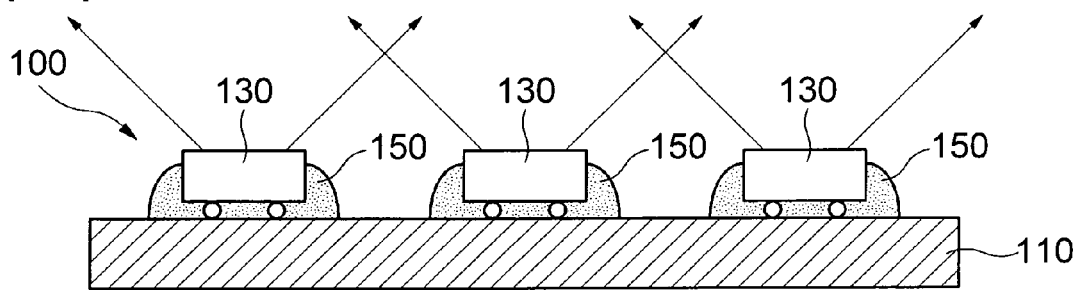
[FIG. 3]
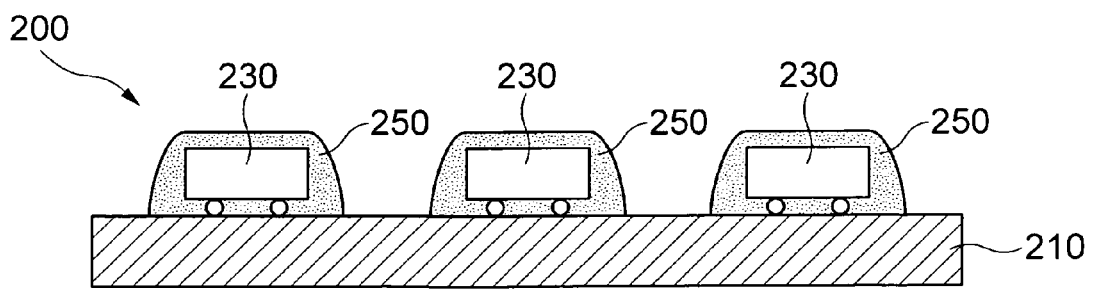

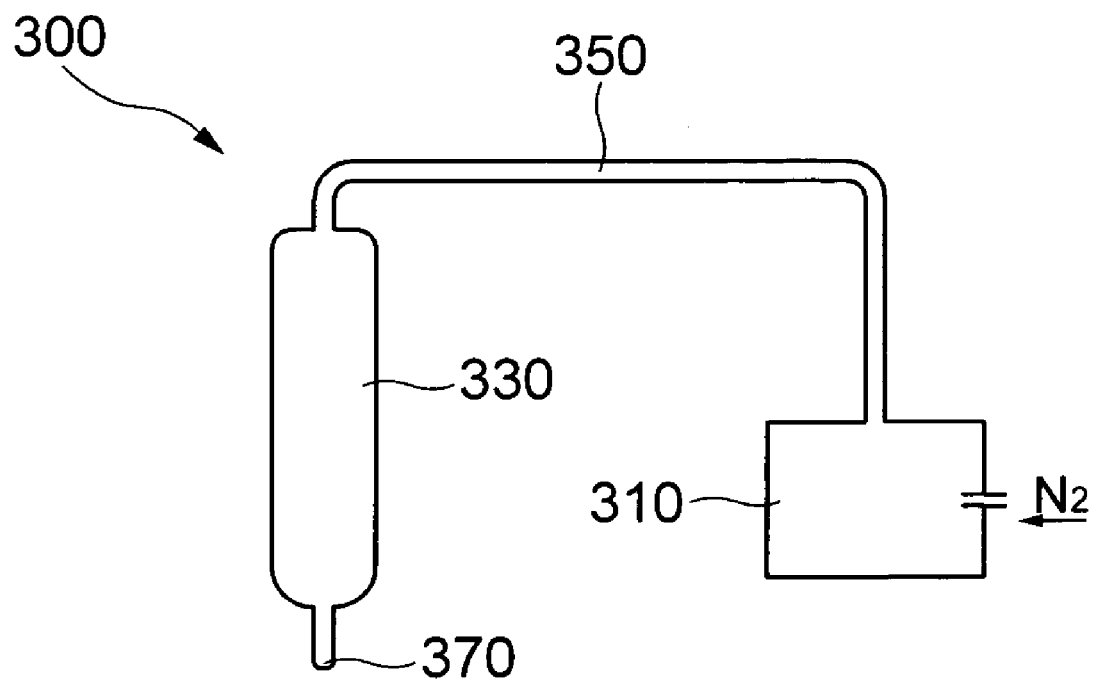
[FIG. 4]

LIGHT EMITTING DIODE MODULE FOR LIGHTING

CROSS-REFERENCE TO RELATED APPLICATIONS

This application claims the benefit of Korean Patent Application No. 10-2007-0052246 filed with the Korea Intellectual Property Office on May 29, 2007, the disclosure of which is incorporated herein by reference.

BACKGROUND OF THE INVENTION

1. Field of the Invention

The present invention relates to a light emitting diode (LED) module for lighting, in which a waterproof agent is applied on terminals exposed between a printed circuit board (PCB) and LED elements on the PCB, thereby preventing erosion of the terminals caused by the permeation of water.

2. Description of the Related Art

LED elements are referred to elements which generate minority carriers (electrons and holes) injected by using a p-n junction structure of semiconductor and then recombine them to emit light. As for the LED elements, there are provided red LED elements formed of GaAsP or the like, green LED elements formed of GaP or the like, and blue LED elements using InGaN/AlGaN double hetero structure.

The LED elements have low power consumption and a long lifespan. Further, the LED elements can be installed in a narrow place and have a strong characteristic against vibration. Such LED elements are used as display elements and backlights. Recently, studies are being actively conducted to apply the LED elements to the use of general lighting.

The LED elements for lighting can be installed in outdoor places or in a pond or river so as to provide a beautiful view to people in the night. Further, the LED elements can provide light in the water such that divers can easily do their jobs under the water.

However, when LED lightings are installed in outdoor places, they should satisfy such a condition as to operate in various environments (weather conditions). When the LED elements are operated in accordance with a weather condition after being mounted on a PCB, the LED elements can endure a change in temperature, but may be damaged by the cut-off or short-circuit of circuits caused by the permeation of water during the rainy season.

Further, when the LED lightings are applied to lightings under the water, an electric shock may occur due to an electric leakage, and they may be easily discharged. Therefore, a structure for preventing water from permeating is separately manufactured, which can house the LED lightings, and is then completely filled with a waterproof agent such as epoxy or silicone, thereby preventing water or moisture from permeating into the structure. Further, since the entire inner portion of the structure should be molded and the structure should be separately manufactured, the volume of the LED module increases, and a manufacturing cost increases.

FIG. 1 is a schematic cross-sectional view of a conventional LED lighting to which a waterproofing structure is applied.

As shown in FIG. 1, the LED lighting 10 which can be used under the water includes a plurality of LED elements 11 mounted on a PCB 13 and a waterproofing structure 15 which houses the LED elements 11.

Inside the waterproofing structure 15, a waterproof agent 17 which is formed of epoxy or silicone and transmits light is filled. The waterproof agent 17 prevents water from permeating into the waterproofing structure 15 from outside, thereby protecting the PCB 13 and the LED elements from the water which causes erosion and electric leakage.

As described above, the LED lighting 10 has an advantage of preventing water from permeating by using the waterproofing structure 15 and the waterproof agent 17. However, since the waterproofing structure and the waterproof agent are used, the volume of the LED lighting 10 increases, and a manufacturing cost increases.

Further, since the waterproof agent 11 is filled on the entire top surfaces of the LED elements 11, some of lights generated from the LED elements 11 are absorbed while passing through the waterproof agent 17. Further, since the propagation direction of the lights is bent, the range of light emission is narrowed, and luminance efficiency decreases.

Further, since the waterproof agent 17 is applied on the entire surfaces of the PCB 13 and the LED elements 11, heat generated from the LED elements 11 is not smoothly radiated because of the waterproof agent 17. Therefore, the lifespan of the LED elements is reduced.

SUMMARY OF THE INVENTION

An advantage of the present invention is that it provides an LED module for lighting, in which a waterproof agent is applied on terminals exposed between a printed circuit board (PCB) and LED elements on the PCB, thereby preventing erosion of the terminals caused by the permeation of water.

Another advantage of the invention is that it provides a method of manufacturing an LED module for lighting.

Additional aspects and advantages of the present general inventive concept will be set forth in part in the description which follows and, in part, will be obvious from the description, or may be learned by practice of the general inventive concept.

According to an aspect of the invention, an LED module for lighting comprises a printed circuit board (PCB); at least one or more LED elements mounted on the PCB; and a waterproof agent surrounding terminals between the PCB and the LED elements, which are exposed on mounting surface of the LED elements.

The PCB may be a FR-4 board, a metal core PCB, or a ceramic substrate.

The waterproof agent may expose the top surface of the PCB excluding the mounting regions of the LED elements, and may be locally applied along the side surfaces of the LED elements.

The waterproof agent may cover the top and side surfaces of the LED elements, or may expose the top surfaces of the LED elements.

The waterproof agent may be silicone and may include a silicone-resin coating agent.

The water proof agent may be epoxy and may include an epoxy-resin coating agent.

The PCB may be fixed to an installation target through a double-faced tape. In this case, the PCB has holes for fastening the screws, the holes being formed on the top surface of the PCB.

According to another aspect of the invention, a method of manufacturing an LED module for lighting comprises the steps of: preparing a PCB; mounting one or more LED elements on the PCB; and applying a waterproof agent along the side surfaces of the LED elements, the waterproof agent covering terminals between the PCB and the LED elements.

The applying of the waterproof agent may be performed by a pneumatic dispensing method or tube-pressure-feed dispensing method.

The applying of the waterproof agent may include the step of exposing the top surface of the PCB excluding the mounting regions of the LED elements.

The applying of the waterproof agent may include the step of applying the waterproof agent on the top and side surfaces of the LED elements.

The applying of the waterproof agent may include the step of applying the waterproof agent on only the side surfaces of the LED elements such that the top surfaces of the LED elements are exposed.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a schematic cross-sectional view of a conventional LED lighting to which a waterproofing structure is applied;

FIG. 2 is a schematic cross-sectional view of an LED module for lighting according to the invention;

FIG. 3 is a cross-sectional view of an LED module for lighting according to another embodiment of the invention; and FIG. 4 is a diagram showing the construction of a pneumatic dispensing device.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, an LED module for lighting according to the present invention will be described in detail with reference to the accompanying drawings.

FIG. 2 is a schematic cross-sectional view of an LED module for lighting according to the invention.

As shown in FIG. 2, the LED module 100 for lighting according to the invention includes a plurality of LED elements 130 and a printed circuit board (PCB) 110 having a circuit module for driving the LED elements 130. A waterproof agent 150 is applied along the side surfaces of the LED elements 130.

The PCB 110 is a more core PCB which is manufactured by attaching a flexible PCB formed of polyimide to the upper portion of a heat radiating body formed of metal with high heat conductivity through an adhesive so as to enhance heat radiating performance. The LED elements 130 are mounted on the top surface of the flexible PCB and are connected to an electrode circuit (not shown) formed on the top surface of the flexible PCB through electric lines or soldering so as to receive currents.

Alternatively, the PCB 110 may be a PCB on which an electrode circuit for electrically connecting the LED elements 130 is formed and which is formed of a resin-based material such as FR-4 or ceramic. The resin-based PCB has a heat radiating body attached to the lower portion thereof.

Although not shown in FIG. 2, a lens for protecting the LED elements is additionally provided on the top surface of the PCB 110. The lens may be constructed in various manners depending on the color of the LED elements. In the invention, however, the protective lens may be omitted.

The LED elements 130, which are electrically connected through the PCB 100, are constructed in an n×m matrix.

The LED elements 130 are composed of at least one or more kinds of red, green, and blue LED elements so as to emit high-brightness white light or multicolor lights.

As described above, the color of the protective lens (not shown) which covers the PCB can be set in various manners depending on the color of the LED elements 130. For example, white LED elements may be used, or colorful LED elements may be arranged and the protective lens may be formed of a colorful phosphor lens.

The waterproof agent 150 is applied along the side surfaces of the LED elements 130 with respect to the mounting surface of the LED elements 130. The top surface of the PCB 110 excluding the mounting surface of the LED elements 130 is exposed.

That is, the waterproof agent 150 covers terminals (for example, electrodes, solder and so on) between the PCB 110 and the LED elements 130 such that the top surfaces of the LED elements 130 and the top surface of the PCB 110 are exposed.

The waterproof agent 150 is composed of a silicone or epoxy material which transmits light. The silicon material may include a silicone resin coating agent, and the epoxy material may include an epoxy resin coating agent. The waterproof agent 150 may be applied on the PCB 110 by a pneumatic dispensing method or a tub-pressure-feed dispensing method.

In the pneumatic dispensing method shown in FIG. 4, a device 300 is used, including a dispenser 330 which has an ejection port with a small width like a syringe, a waterproof agent storing tank 310 which stores a waterproof agent, and a nozzle 350 which mechanically connects the waterproof agent storing tank 310 to the dispenser 330.

That is, as nitrogen ($N_2$) gas is supplied to the waterproof agent storing tank 310, the pressure of the waterproof agent storing tank 310 is increased by the nitrogen gas such that the waterproof agent 350 stored in the waterproof agent storing tank 310 is supplied to the dispenser 330 through the nozzle 350. Then, the waterproof agent supplied to the dispenser 330 is coated on the PCB through the ejection port 370 formed at the end of the dispenser 330.

Therefore, an amount of waterproof agent to be applied on the PCB 110 can be adjusted depending on the pressure of the nitrogen gas injected into the waterproof agent storing tank 310.

In the tube-pressure-feed dispensing method, a screw is fastened to the upper portion of the dispenser or the waterproof storing tank, and an amount of waterproof agent to be coated is adjusted by rotating the screw. That is, the amount of waterproof agent to be applied is determined by the number of rotations of the screw. In other words, as the screw is rotated, the pressure of the dispenser or the waterproof agent storing tank increases. Then, an amount of waterproof agent ejected through the dispenser increases.

As described above, the PCB is locally coated with the waterproof agent 150 of the invention by the known methods. In addition to the methods, an operator may manually apply the waterproof agent 150.

The invention is not limited to the dispensing methods. Another method can be applied as long as the waterproof agent 150 is formed along the side surfaces of the LED elements 130 such the top surface of the PCB 110 can be exposed, as shown in FIG. 2.

Continuously, referring to FIG. 2, the features of the LED module for lighting will be described. As the waterproof agent 150 is locally applied on only the mounting regions of the LED elements 130, the volume of the LED module can be reduced, because a separate structure for preventing water from permeating is not used. In the related art, the waterproofing structure is separately provided, and the PCB having the LED elements provided thereon is built in the waterproofing structure. Further, the waterproofing structure is filled with a waterproof agent so as to prevent water from permeating into the LED module. In the invention, however, only the terminals exposed to the outside are covered without such a waterproofing structure. Therefore, the waterproofing structure can be omitted.

Further, since the waterproof agent 150 is locally applied on only the mounting regions of the LED elements 130, the amount of waterproof agent can be reduced, which makes it possible to reduce a manufacturing cost. That is, in the related art, the waterproof agent should be filled in the waterproofing structure such that the LED elements are submerged. In the invention, however, since the waterproof agent is locally applied on only the mounting regions of the LED elements, the amount of waterproof agent to be applied is considerably reduced.

Furthermore, in the invention, the top surface of the PCB 110 excluding the mounting regions of the LED elements 130 is exposed as it is. Therefore, heat radiation efficiency is maximized, which makes it possible to enlarge the lifespan of the LED elements 130. That is, since the top and bottom surfaces of the PCB 110 are exposed to the air or water, heat generated from the LED elements 130 can be more effectively radiated than in the related art. Accordingly, the deterioration of the LED elements 130 is prevented, which makes it possible to enlarge the lifespan of the LED elements.

Meanwhile, the top surfaces of the LED elements 130 may be all covered by the waterproof agent 150.

FIG. 3 is a cross-sectional view of an LED module for lighting according to another embodiment of the invention. As shown in FIG. 3, the LED module 200 for lighting includes a plurality of LED elements 230 and a PCB 210 having a circuit module for driving the LED elements 230. A waterproof agent 250 is applied on the mounting regions of the LED elements 230 so as to cover the side and top surfaces of the LED elements 130.

In this embodiment, since the top surfaces of the LED elements 230 are covered by the waterproof agent 250, luminance efficiency is degraded in comparison with the previous embodiment.

In the previous embodiment (refer to FIG. 2), the waterproof agent 150 is applied on only the side surfaces of the LED elements 130, and the top surfaces of the LED elements 130 are exposed. Therefore, it is possible to prevent a reduction in luminance efficiency caused by the waterproof agent 150.

In this embodiment, however, when the waterproof agent 250 is applied on the top surfaces of the LED elements 230, some of lights generated from the LED elements 230 are absorbed while passing through the waterproof agent 250. Therefore, the luminance efficiency decreases. Further, the propagating direction of the lights is bent due to a difference between the refractive index of the air or water and the refractive index of the waterproof agent 250. Then, the emission range of the lights is narrowed.

Therefore, in this embodiment, the luminance efficiency may decrease. In the previous embodiment (refer to FIG. 2), however, since the top surfaces of the LED elements 130 are completely exposed to the air or water, the lights are not absorbed by the waterproof agent, and the propagation direction of the lights is not bent.

As described above, the LED module for lighting according to the invention can be fixed to installation targets such as outdoor electric bulletin boards and the bottom and wall surface of ponds through a double-faced tape. In addition to the double-faced tape, bond with an excellent adhesive property may be applied.

The LED module may be fixed to installation targets through screws. In this case, holes for fastening screws should be separately provided on the PCB.

As described above, the basic concept of the invention is that the waterproof agent is locally applied on only regions (where the terminals between the PCB and the LED elements are exposed) in which erosion or electric leakage caused by permeation of water can occur, the waterproofing structure is removed, and the PCB is exposed to the air or water at the maximum, thereby maximizing the heat radiation area and enlarging the lifespan of the LED elements. Therefore, it will be understood by those skilled in the art that various changes and modifications in form and detail may be made therein without departing from the scope of the present invention.

According to the present invention, as the waterproof agent for covering electrode terminals exposed to the outside is locally applied on the side surfaces of the LED elements, the structure for preventing water from permeating can be omitted, which makes it possible to reduce the thickness of the LED module for lighting.

Further, as the waterproof agent is locally applied, the amount of waterproof agent to be used is reduced, which makes it possible to a manufacturing cost.

Furthermore, as the exposed area of the PCB is maximized by the local application of the waterproof agent, the heat radiation efficiency is maximized, which makes it possible to enlarge the lifespan of the LED elements.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A light emitting diode (LED) module for lighting comprising:
  a printed circuit board (PCB);
  at least one or more LED elements mounted on the PCB; and
  a waterproof agent surrounding terminals between the PCB and the LED elements, which are exposed on mounting surface of the LED elements,
  wherein the waterproof agent is locally applied along the side surfaces of the LED elements.

2. The LED module for lighting according to claim 1, wherein the PCB is a FR-4 board.

3. The LED module for lighting according to claim 1, wherein the PCB is a metal core PCB.

4. The LED module for lighting according to claim 1, wherein the PCB is a ceramic board.

5. The LED module for lighting according to claim 1, wherein the waterproof agent exposes the top surface of the PCB excluding the mounting regions of the LED elements.

6. The LED module for lighting according to claim 1, wherein the waterproof agent covers the top and side surfaces of the LED elements.

7. The LED module for lighting according to claim 1, wherein the waterproof agent exposes the top surfaces of the LED elements.

8. The LED module for lighting according to claim 1, wherein the waterproof agent is silicone.

9. The LED module for lighting according to claim 1, wherein the silicone includes a silicone-resin coating agent.

10. The LED module for lighting according to claim 1, wherein the water proof agent is epoxy.

11. The LED module for lighting according to claim 10, wherein the epoxy includes an epoxy-resin coating agent.

12. The LED module for lighting according to claim 1, wherein the PCB is fixed to an installation target through a double-faced tape.

13. The LED module for lighting according to claim 1, wherein the PCB is fixed to an installation target through screws.

14. The LED module for lighting according to claim 13, wherein the PCB has holes for fastening the screws, the holes being formed on the top surface of the PCB.

15. A method of manufacturing an LED module for lighting, comprising the steps of:
preparing a PCB;
mounting one or more LED elements on the PCB; and
applying a waterproof agent along the side surfaces of the LED elements, the waterproof agent covering terminals between the PCB and the LED elements, wherein the waterproof agent is locally applied along the side surfaces of the LED elements.

16. The method according to claim 15, wherein the applying of the waterproof agent is performed by a pneumatic dispensing method.

17. The method according to claim 15, wherein the applying of the waterproof agent is performed by a tube-pressure-feed dispensing method.

18. The method according to claim 15, wherein the applying of the waterproof agent includes the step of exposing the top surface of the PCB excluding the mounting regions of the LED elements.

19. The method according to claim 18, wherein the applying of the waterproof agent includes the step of applying the waterproof agent on the top and side surfaces of the LED elements.

20. The method according to claim 18, wherein the applying of the waterproof agent includes the step of applying the waterproof agent on only the side surfaces of the LED elements such that the top surfaces of the LED elements are exposed.

* * * * *